United States Patent
Hakkens et al.

(10) Patent No.: US 10,797,217 B2
(45) Date of Patent: Oct. 6, 2020

(54) ACTUATOR OR SENSOR DEVICE BASED ON AN ELECTROACTIVE POLYMER

(71) Applicant: KONINKLIJKE PHILIPS N.V., Eindhoven (NL)

(72) Inventors: Franciscus Johannes Gerardus Hakkens, Eersel (NL); Cornelis Petrus Hendriks, Eindhoven (NL); Daan Anton van Den Ende, Breda (NL); Roland Alexander van De Molengraaf, Geldrop (NL); Valentina Lavezzo, Heeze (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 406 days.

(21) Appl. No.: 15/561,718

(22) PCT Filed: Mar. 24, 2016

(86) PCT No.: PCT/EP2016/056481
§ 371 (c)(1),
(2) Date: Sep. 26, 2017

(87) PCT Pub. No.: WO2016/156175
PCT Pub. Date: Oct. 6, 2016

(65) Prior Publication Data
US 2018/0108827 A1    Apr. 19, 2018

(30) Foreign Application Priority Data
Mar. 31, 2015 (EP) ..................... 15161978

(51) Int. Cl.
*H01L 41/083* (2006.01)
*H01L 41/047* (2006.01)
(Continued)

(52) U.S. Cl.
CPC ........ *H01L 41/083* (2013.01); *H01L 41/0471* (2013.01); *H01L 41/0926* (2013.01); *H01L 41/1132* (2013.01); *H01L 41/193* (2013.01)

(58) Field of Classification Search
CPC . H01L 41/193; H01L 41/083; H01L 41/1132; H01L 41/0926; H01L 41/0471
(Continued)

(56) References Cited

U.S. PATENT DOCUMENTS

| 6,060,811 A * | 5/2000 | Fox ..................... H01L 41/0926 310/311 |
| 7,259,495 B2 * | 8/2007 | Asai ..................... H02N 11/006 310/311 |

(Continued)

FOREIGN PATENT DOCUMENTS

| CN | 103227279 A | 7/2013 |
| EP | 1919072 A1 | 5/2008 |

(Continued)

OTHER PUBLICATIONS

Sato, et al., "Driving Mode Control of a Multilayered Thin Electrostatic Actuator Supported by Lubricating Oil Fol Ultra-Precision Positioning", Interdisciplinary Graduate School of Science and Engineering, Tokyo Institute of Technology, Yokohama, Japan (Abstract).

(Continued)

*Primary Examiner* — J. San Martin
(74) *Attorney, Agent, or Firm* — Schott, PC.

(57) ABSTRACT

A bending actuator device or sensor device for sensing bending comprises a stack of electroactive polymer units. The adjacent electroactive polymer units in the stack are slidable relatively to each other. This means that, for an actuator for example, an increased actuation force is enabled without requiring increased driving voltage, and it also (Continued)

avoids the problems of stress build up by allowing sliding between the units.

17 Claims, 6 Drawing Sheets

(51) Int. Cl.
  *H01L 41/09* (2006.01)
  *H01L 41/193* (2006.01)
  *H01L 41/113* (2006.01)
(58) Field of Classification Search
  USPC .......................................................... 310/800
  See application file for complete search history.

(56) References Cited

U.S. PATENT DOCUMENTS

| | | | |
|---|---|---|---|
| 7,410,086 B2 | 8/2008 | Ortiz et al. | |
| 2003/0006669 A1* | 1/2003 | Pei ........................ | A61M 5/142 310/309 |
| 2006/0232166 A1 | 10/2006 | Vogeley | |
| 2009/0255187 A1* | 10/2009 | Alexander ............. | B60J 10/244 49/477.1 |
| 2012/0080980 A1 | 4/2012 | Kaal et al. | |
| 2013/0117980 A1 | 5/2013 | Kwon et al. | |
| 2018/0103747 A1* | 4/2018 | Lavezzo ................ | A46B 5/007 |
| 2018/0248105 A1* | 8/2018 | Van Den Ende ..... | H01L 41/193 |
| 2018/0248497 A1* | 8/2018 | Hendriks ............. | H01L 41/193 |

FOREIGN PATENT DOCUMENTS

| | | |
|---|---|---|
| EP | 2136417 A2 | 12/2009 |
| EP | 1919072 B1 | 7/2012 |
| EP | 2264801 B1 | 10/2012 |
| JP | H09-267279 A | 10/1997 |
| JP | 2003-505865 A | 2/2003 |
| JP | 2008-118851 A | 5/2008 |
| JP | 2010-226949 A | 10/2010 |
| JP | 2011-030400 A | 2/2011 |
| WO | 0106579 A2 | 1/2001 |

OTHER PUBLICATIONS

Helmut Schlaak, "Electroactive Polymers", Microtechnology, http://www.emk.tu-darmstadt.de/en/mems/research/electroactive-polymers/, 2 pages (Abstract).

* cited by examiner (a)

(b)

(c)

(d)

(e)

(a)

(b)

ACTUATOR OR SENSOR DEVICE BASED ON AN ELECTROACTIVE POLYMER

CROSS-REFERENCE TO PRIOR APPLICATIONS

This application is the U.S. National Phase application under 35 U.S.C. § 371 of International Application No. PCT/EP2016/056481, filed on Mar. 24, 2016, which claims the benefit of European Application Ser. No. 15,161,978.0, filed Mar. 31, 2015. These applications are hereby incorporated by reference herein, for all purposes.

FIELD OF THE INVENTION

This invention relates to actuator or sensor devices which make use of electroactive polymers.

BACKGROUND OF THE INVENTION

Electroactive polymers (EAP) are an emerging class of materials within the field of electrically responsive materials. EAP's can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP material give rise to applicability to new applications.

An EAP device can be used in any application in which a small amount of movement of a component or feature is desired, based on electric actuation. Similarly, the technology can be used for sensing small movements.

The use of EAPs enables functions which were not possible before, or offers a big advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-20 kHz.

Devices using electroactive polymers can be subdivided into field-driven and ionic-driven materials.

Examples of field-driven EAPs are dielectric elastomers, electrostrictive polymers (such as PolyVinylidenDiFluoride based relaxor polymers or polyurethanes) and liquid crystal elastomers (LCE).

Examples of ionic-driven EAPs are conjugated polymers, carbon nanotube (CNT) polymer composites and Ionic Polymer Metal Composites (IPMC).

Field-driven EAP's are actuated by an electric field through direct electromechanical coupling, while the actuation mechanism for ionic EAP's involves the diffusion of ions. Both classes have multiple family members, each having their own advantages and disadvantages.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

The expansion and consequent movement or change in shape of the EAP device is in many cases used to deliver an actuation force to an external component. Depending on the nature of the external component, the force required will vary. In some cases, the force delivered by a device with a single EAP layer may not be sufficient for the intended purpose.

Methods to increase the force of electroactive polymer bending actuators are known. For example, by making actuators thicker, the force (as well as voltage) increases. However, this also results in increased internal stresses and stiffness, which will therefore be accompanied by reduced deflection distance.

It is also known to laminate multiple single EAP elements in a stack. The force delivered by the thicker stack increases but without the need for an increase in voltage. However, again as a result of the enlarged total thickness, internal stress levels become larger reducing the actuator stroke. Towards the surfaces of the actuator stack, tensile and compressive stresses in the EAP layer (or backing material or electrodes) become larger. These internal stresses reduce the efficiency of the actuator so that there is a lower useful energy delivery (which can be expressed by the actuation force×actuation stroke).

There is therefore a need for an actuator design which enables an increase in delivered force but without the problem of reduced efficiency and therefore energy delivery. Similarly, an increase in efficiency can allow more efficient signal generation in response to an applied force for a sensor application.

SUMMARY OF THE INVENTION

It is an object of the invention to at least partly fulfill the aforementioned need. The object is reached with the invention as defined by the independent claims. The dependent claims provide advantageous embodiments.

According to examples in accordance with an aspect of the invention, there is provided a bending actuator device or a sensor device for sensing bending comprising:

a stack of electroactive polymer units, each comprising at least one electroactive polymer layer and control electrodes for driving the electroactive polymer layer so that it deforms in response to a drive signal applied to the drive electrodes or for sensing a signal generated in response to deformation of the electroactive polymer layer, wherein the adjacent electroactive polymer units in the stack are slidable relatively to each other.

This arrangement enables an increase in the total actuation force without requiring increased driving voltage, and it also avoids the problems of stress build up. During bending, relative sliding takes place at the interface between adjacent electroactive polymer units, thereby avoiding stress build up and enabling more efficient conversion of electrical to mechanical energy or improved sensor functionality for converting a mechanical input into an electrical sensed signal.

In a first arrangement, the electroactive polymer units are stacked with adjacent electroactive polymer units in frictional contact with each other. This frictional contact may allow relative sliding of the units, and this relative sliding relieves stresses in the units as mentioned above. Thus, a laminated structure is defined but with no fixed coupling between the layers in the laminate. Instead, a mechanical coupling is used which clamps the units together in the stacking direction but allows sliding movement.

Each unit may for example comprise electrodes on opposite sides of the electroactive polymer layer, wherein the drive electrodes are formed from a low friction, elastic or viscous material layer. By selecting suitable materials for the electrode layers, the stacking of the units, in contact with each other, can give a low friction interface between the units.

There may instead be an additional friction reducing layer between each adjacent pair of electroactive polymer units. This enables the friction to be reduced between the adjacent units in the stack while enabling conventional materials to be used for the individual EAP units.

In one set of examples, the friction reducing layer may be freestanding, or else it may be bonded to the electroactive polymer unit on one side. This gives either one surface of the friction reducing layer where relative sliding takes place or relative sliding can take place on both surfaces. The friction reducing layer then typically comprises a solid material layer.

This solid material layer may for example comprise PTFE, a fluoropolymer, a textile, a fluid, a gel, a foam or a foil.

In another set of examples, the friction reducing layer is bonded to the electroactive polymer units on each side, and the friction reducing layer comprises an elastic layer or a viscous material layer.

In this way, the stack is bonded together (which may for example avoid the need for further mechanical coupling) but the friction reducing layer allows relative sliding between its opposite faces (in the stacking direction). Shear within the material of the friction reducing layer is thus allowed.

In another arrangement, the friction reducing layer comprises a spacer arrangement. This avoids contact between the units over most of their area. The spacer arrangement has spacers which are positioned to avoid contact and allow relative sliding.

In all examples, a mechanical coupling may be provided between the electroactive polymer units, which fixes the relative positions in the stacking direction, but allows relative movement in the in-plane direction.

The device may further comprise a holder for setting the in-plane location of the stack. This holder may be used instead of providing rigid fixing to the stack, so that the bending of the stack is not constrained. For example there may be lateral space all around the stack so that the stack has a constrained amount of movement in-plane, but has the greatest stroke and force delivery or force sensing capability in the perpendicular (i.e. stacking) direction.

The holder may comprise a housing having a recess in which the stack of units is located. A lid may be provided over the stack of units, which forms an input or output interface for the device. The stack of units may for example be sandwiched between a base of the recess and the lid without physical connection between the units of the stack.

The device for example comprises a bending actuator. The force delivered by the device is increased by having multiple stacked actuators.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an electroactive polymer actuator or sensor device comprising a stack of electroactive polymer units. The units are designed to bend, i.e. generate or sense a deformation out of the plane of the stack layers, namely in the stacking direction. The adjacent electroactive polymer units (i.e. individual actuator or sensor units) in the stack are slidable relatively to each other. In the case of an actuator, this means that an increased actuation force is enabled without requiring increased driving voltage, and it also avoids the problems of stress build up by allowing sliding between the individual actuators in the stack. The sliding motion which is allowed is in the in-plane direction, perpendicular to the stacking direction. This relative sliding motion is for example needed when an actuator bends, as different levels within the stack will experience different bend radius and/or arc length. As a result, by allowing relative shearing movement between layers, the build of stresses in the layers is avoided.

The slidable arrangement means the different units are not rigidly bonded together in the in-plane directions.

The invention will now be described with reference to various actuator designs. The same structural features may however also be used as a sensor. Thus, the examples below use a stack of actuators, but more generally these are EAP "units" which may be actuator units or sensor units.

Figure 1:
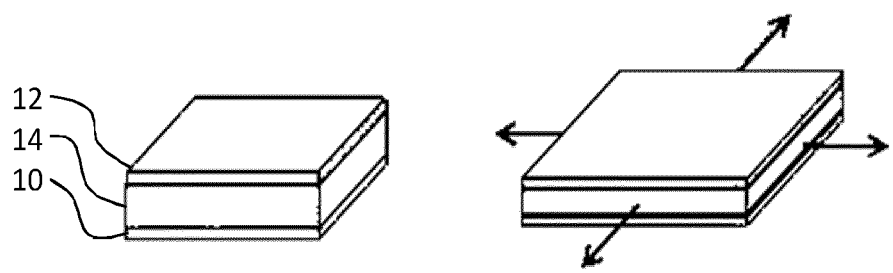
FIG. 1 shows a known electroactive polymer device which is not clamped.
Figure 2:
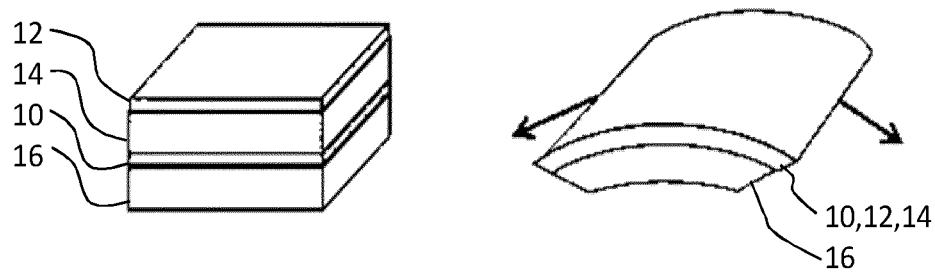
FIG. 2 shows a known electroactive polymer device which is constrained by a backing layer.
Figure 3:
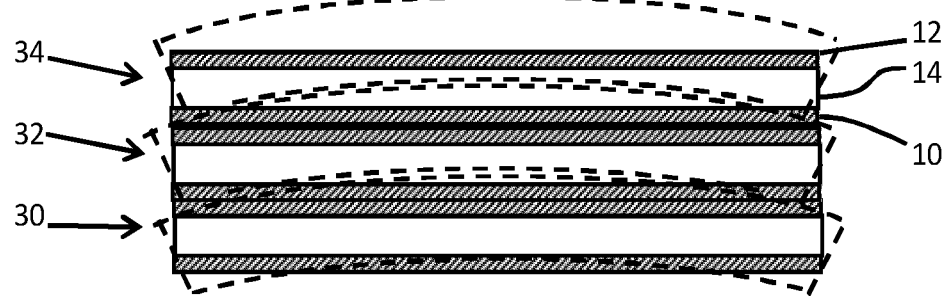
FIG. 3 shows a first example of EAP actuator device.

FIG. 3 shows a first arrangement comprising three actuators 30, 32, 34 which are stacked in physical frictional contact with each other. Each actuator comprises the layer structure 10, 12, 14 as explained above, optionally including a carrier (backing) layer although this is not shown in FIG. 3.

The actuators are bending actuators, which deform between a flat state (shown in solid lines) and a bent state (shown in dotted lines). The flat state does not in fact need to be flat, and it may also have a bend with a larger radius of curvature than the bent state. For ease of representation, only the flat state is illustrated in some of the examples below (in particular FIGS. 6 to 10). For the avoidance of doubt, all examples herein are bending actuators.

The frictional contact allows relative sliding of the actuators, and this relative sliding relieves stresses in the actuators. Thus, a laminated structure is defined but with no fixed coupling between the layers in the laminate. Instead, a mechanical coupling (not shown in FIG. 3) is used which clamps the actuators together in the stacking direction but allows sliding movement in the perpendicular, in-plane direction.

This mechanical coupling may comprise a connection which extends in the stacking direction. For example, a central connection part may fix the in-plane relative positions of the different actuators, so that the way the actuators move when deformed is constrained in a symmetric way.

Alternatively, the stack of actuators may be provided within a housing, which fixes the lateral positions of the actuators of the stack.

The structure of FIG. 3 has been tested to compare the actuation force which can be produced with the actuation force which can be achieved by the individual units that make up the structure.

Figure 4:
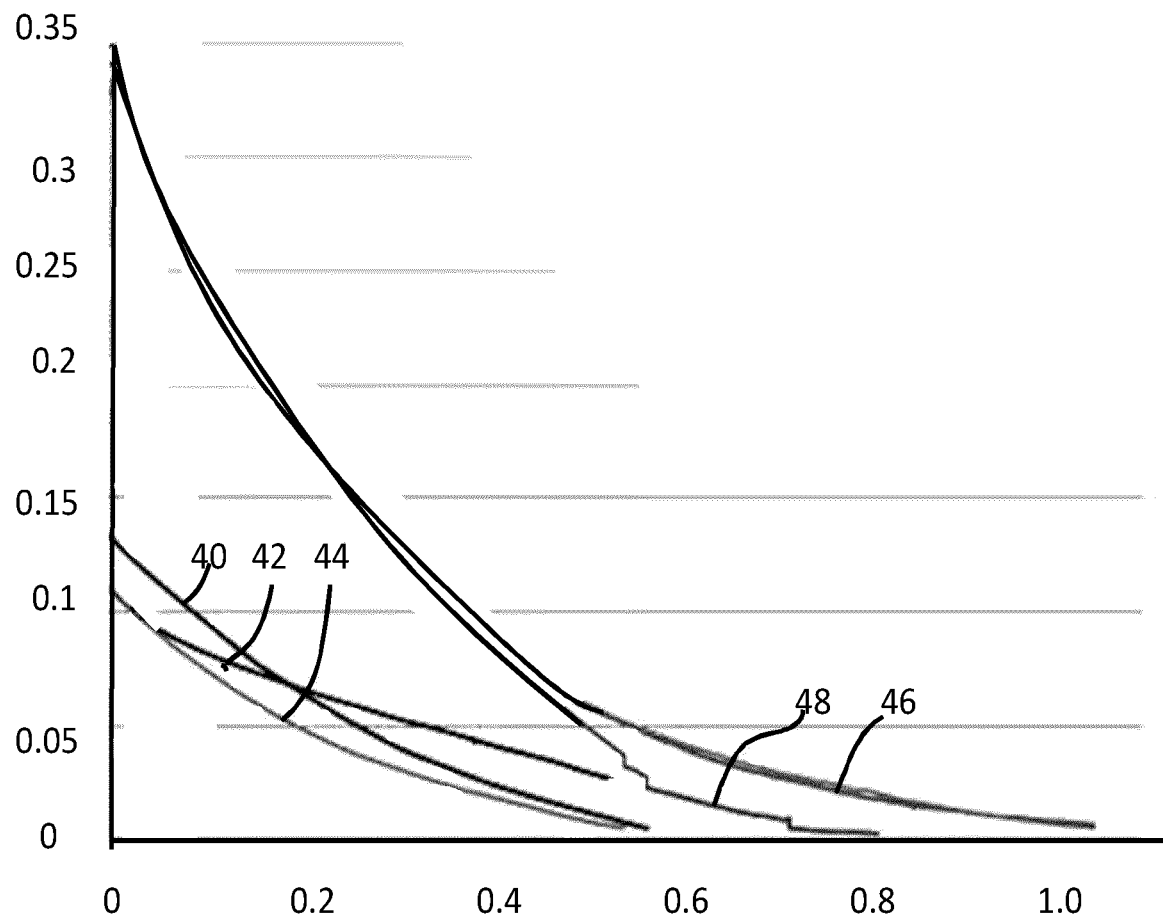
FIG. 4 shows graphs showing the mechanical performance of the device of FIG. 3 compared to the individual actuators which make up the device.

FIG. 4 shows a plot of the actuation force generated (y-axis) versus the displacement (x-axis). The displacement is measured as the deviation from flat (i.e. the maximum height difference deviation from flat).

Plots 40, 42 and 44 are for the three individual actuator responses. Plot 46 is for the combined actuator. Plot 48 is based on a theoretical calculation of the expected response.

All measurements are at 250 Volts. An electroactive polymer can be used to generate a maximum force but this corresponds to a condition of no displacement. Alternatively, a maximum displacement can be obtained but then it cannot generate force. Thus, at each displacement (the height of bended actuator) the force is measured that the actuator can generate in that position against a force measurement probe. This can be determined by very slightly bending the actuator then increasing an external a force until the EAP starts to deform, until it reaches its flat state. The maximum force at zero bending height is obtained in this way. The external force applied to the EAP is then reduced progressively, and the EAP starts to bend. In that way the force at each height is measured, always at the same driving voltage.

The total actuation force is the sum of the force of the individual actuators. Each actuator elements comprises an EAP layer (which itself may comprises multiple sub-layers), electrode layers and a backing carrier layer.

FIG. 3 shows that each actuator has drive electrodes 10, 12 on opposite sides of the electroactive polymer layer, and these drive electrodes are in contact with each other.

In such a case, the voltages on the adjacent electrodes need to be the same. Since the EAP actuation is symmetric with respect to the polarity of the applied voltage, the voltages applied to adjacent layers may indeed be the same while still actuating all units. For example, the bottom electrode may be set to +120V, the pair of electrodes at the next junction may be set to −120V, the pair of electrodes at the next junction may be set to +120V and so on. Thus, there is no need to provide electrical insulation between the electrodes which are adjacent.

The standard electrode materials used in EAP devices may be brought into contact to define the frictional (but non-bonded) interface. However, the electrodes may instead be formed from a low friction, elastic or viscous material layer. By selecting suitable materials for the electrode layers, the stacking of the actuators, in contact with each other, can give a lower friction interface between the actuators.

Figure 5:
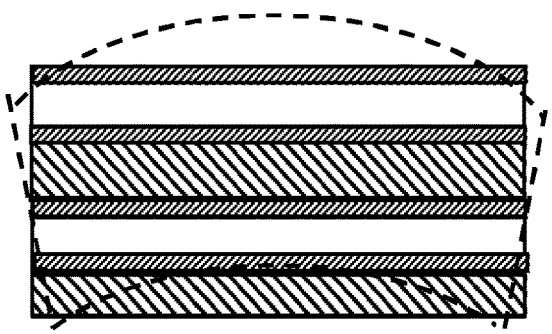
FIGS. 5(a) to (d) shows four different possible ways to stack actuator in general outline and FIG. 5(e) shows one example in more detail.
Figure 5:
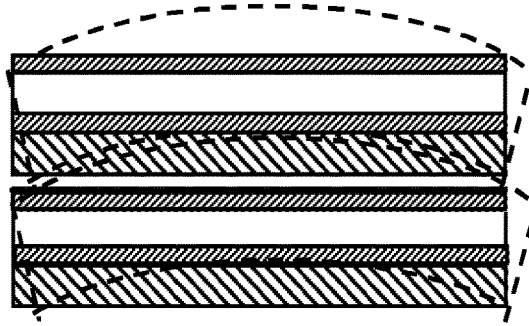
Figure 5:
Figure 5:
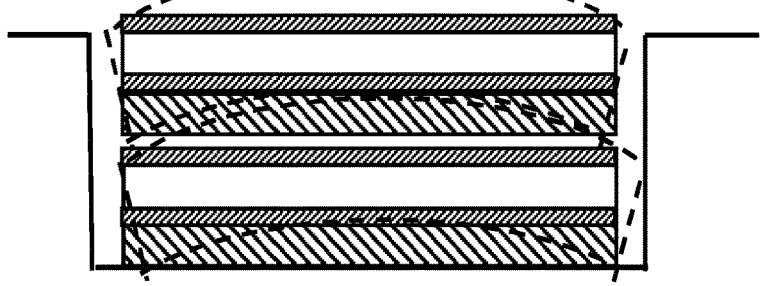
Figure 5:
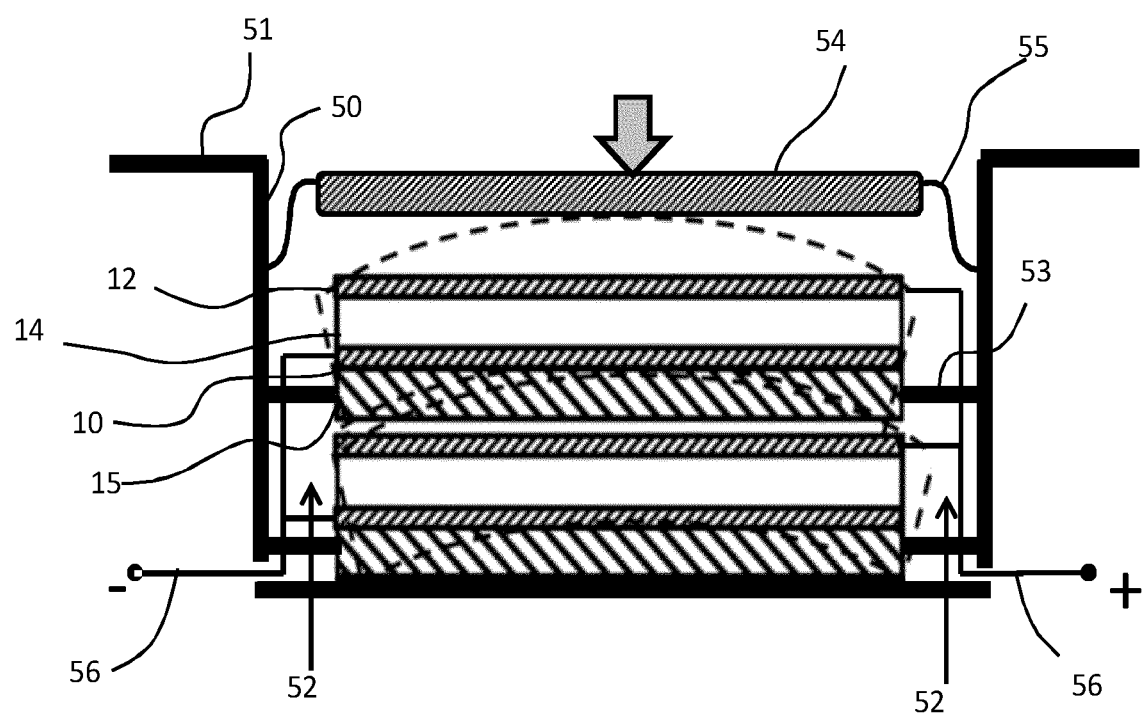

FIG. 5 shows three possible configurations for comparison with a bonded laminate structure.

FIG. 5(a) shows two actuators (each having a carrier layer, two electrode layers and the EAP layer) bonded together. They deforms as a unit (as shown by dotted lines) giving rise to large tensile stresses at the large radius outer surface and large compressive stresses at the smaller radius inner surface.

FIG. 5(b) shows two actuators (again each having a carrier layer, two electrode layers and the EAP layer) loosely stacked. Each deforms independently with relative sliding.

FIG. 5(c) shows that the two actuators of FIG. 5(b) may be fixed together at one position, for example the middle.

FIG. 5(d) shows that the two actuators of FIG. 5(b) may be fixed in a cavity to constrain any lateral movement.

FIG. 5(e) shows an implementation of FIG. 5(d) in more detail.

The cavity 50 is a recess in a holder 51 for setting the in-plane location of the stack. This avoids the need for any rigid fixings (in the in-plane direction) to the EAP layer 14 of each unit, so that the bending of the stack is not constrained. For example, there is lateral space 52 all around the EAP layers 14 (and electrode layers) in the stack within the cavity 50 so that the stack has a constrained amount of movement in-plane, but has the greatest stroke and force delivery or force sensing capability in the perpendicular (i.e. stacking) direction. Anchor parts 53 may be used to center the stack in the recess, and these anchor parts 53 locate a support substrate 15 of each individual unit. This location prevents unwanted lateral displacements causing wear, but without adversely affecting the force delivery or sensor functionality. The anchor parts 53 contact the support substrates 15 using a geometrical fit, without being fixed to the support substrates 15.

The device has a lid 54 which functions as the actuator output or sensor input. It is connected to the housing 51 by a deformable mechanical connection 55. Flexible electrical connections 56 are made to the electrode layers 10, 12 through feedthrough openings which lead into the cavity 50.

It is possible to avoid any connection between the different units in the stack by simply sandwiching them between the base of the recess 50 and the lid 54.

Depending on design and surface conditions of the actuator elements, the friction between loosely stacked single elements may generate internal stresses which lower the effective energy that can be delivered, to an undesirable level.

Figure 6:
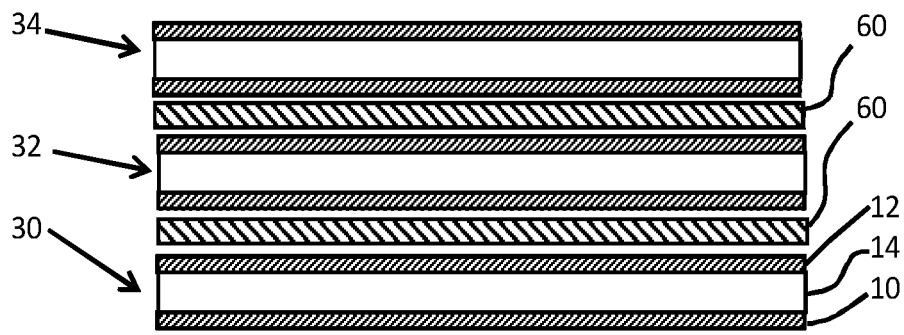
FIG. 6 shows a second example of EAP actuator device.
Figure 7:
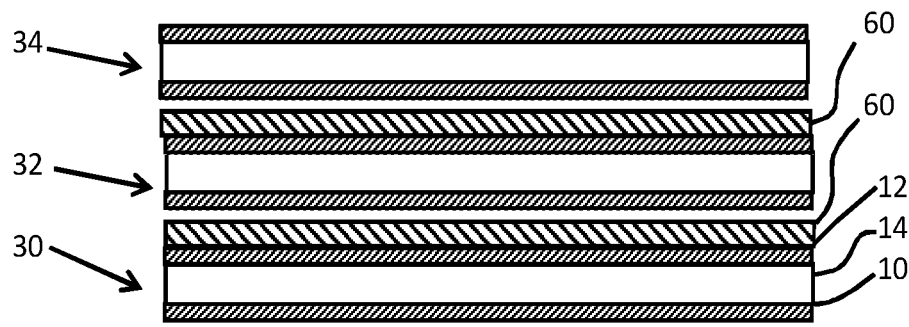
FIG. 7 shows a third example of EAP actuator device.

FIG. 6 shows a design for addressing this issue, which reduces friction between adjacent actuators. There is an additional friction reducing layer 60 between each adjacent pair of actuators 30, 32, 34. This enables the friction to be reduced between the adjacent actuators in the stack while enabling conventional materials to be used for the individual EAP actuators.

This material can be a low friction foil for example PTFE, other fluoropolymer, a textile, a fluid, a gel, a foam, a foil with a surface texture, or in general any conformable material.

FIG. 6 shows that the layers 60 are not physically connected to the adjacent actuators, but instead comprise freestanding layers. Relative sliding can thus take place on both sides of the friction reducing layer 60.

The friction reducing layer may instead be bonded to the electroactive polymer actuator on one side as shown in FIG.

7. This means that relative sliding takes place at one surface of the friction reducing layer.

The friction reducing layer then comprises a solid material layer so that it can be bonded to one of the actuators. This bonding may be by a coating or lamination process.

This solid material layer may for example comprise PTFE, a fluoropolymer, a textile, a fluid, a gel, a foam or a foil.

Figure 8:
FIG. 8 shows a fourth example of EAP actuator device.

In the example of FIG. 8, the friction reducing layer is bonded to the electroactive polymer actuators on each side. The friction reducing layer then comprises an elastic layer or a viscous material layer or a layer which otherwise conforms to the layers on the opposite sides. Again, the friction reducing layer comprises a solid material layer so that it can be bonded to the two actuators, for example by a coating or lamination process.

In this way, the stack is bonded together (which may for example avoid the need for further mechanical coupling) but the friction reducing layer allows relative sliding between its opposite faces (i.e. opposite in the stacking direction). Shear within the material of the friction reducing layer is thus allowed so that the opposite sides can conform locally to the shape and lateral positioning of the actuator on each side.

Figure 9:
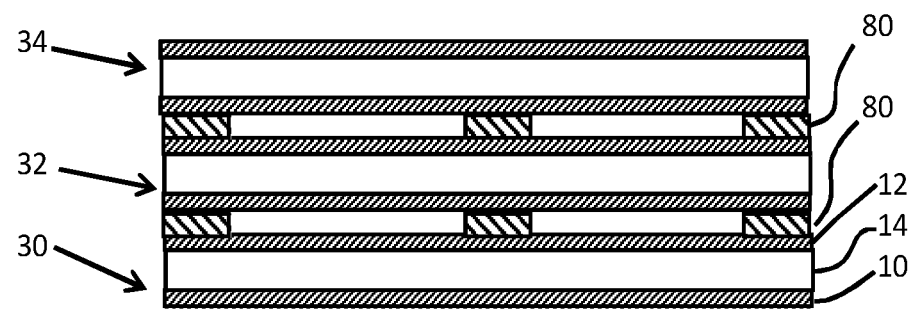
FIG. 9 shows a fifth example of EAP actuator device.

In another arrangement as shown in FIG. 9, the friction reducing layer comprises a spacer arrangement 80. This provides a set of spacers over the area of the actuator. This avoids contact between the actuators over most of their area. The spacer arrangement has spacers which are positioned to avoid contact and allow relative sliding. A mechanical coupling or an enclosure as discussed above fixes the relative positions in the stacking direction, but allows relative movement in the in-plane direction.

As described above, a mechanical coupling which does not fix the relative in-plane positions (other than optionally at a single reference point) may be used. This is of particular interest for thicker stacks, or where large displacements are envisaged. Thus, a geometrical connection rather that a rigid physical clamping or gluing may be used.

Figure 10:
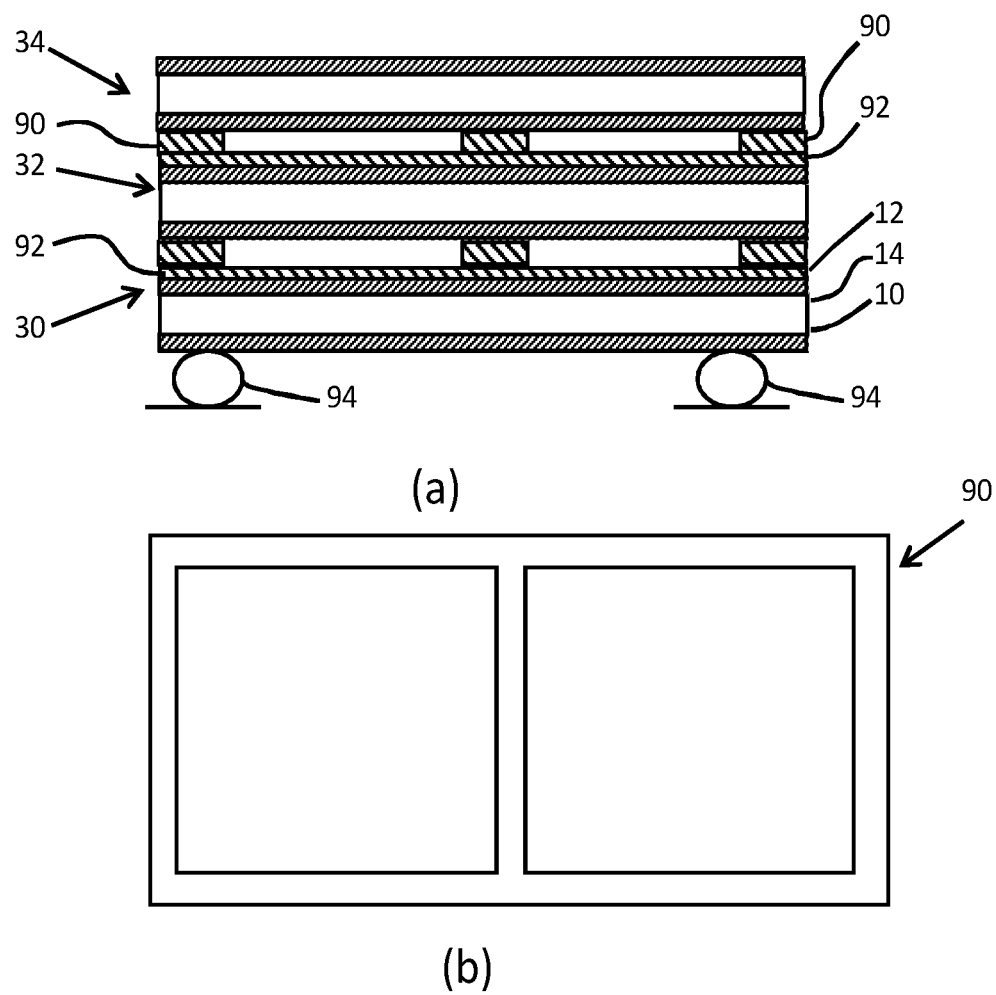
FIG. 10 shows a sixth example of EAP actuator device.
Figure 11:
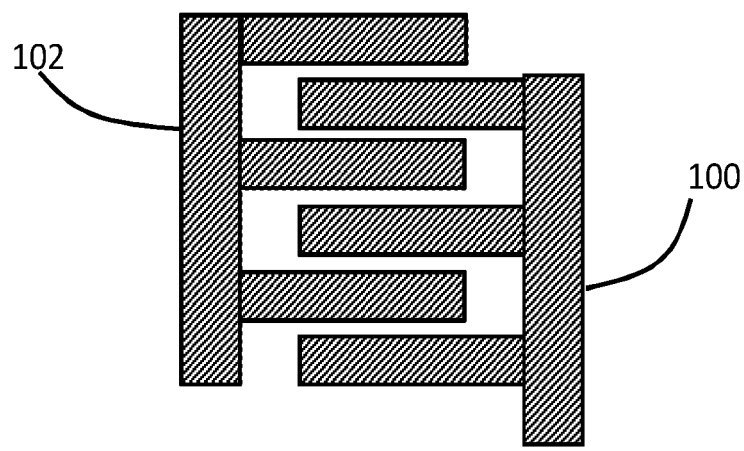
FIG. 11 shows an in-plane electrode arrangement.

FIG. 10 shows an arrangement in which a frame 90 as shown in FIG. 10(b) functions as a spacer arrangement. The frame is attached to one actuator by an adhesive stack 92 so that the relative sliding takes place between the frame 90 and the other actuator which it contacts.

FIG. 10 also shows supports 94 which are used to constrain the bending (in known manner).

All other examples above will include fixing points, such as the supports 94, to an external frame or structure which functions as a reference point.

The examples above are based on a stack of three EAP actuators. There may be as few as two actuators in the stack, but there could be as many as tens of actuators.

Thus, there may for example be between 2 and 10 actuators in the stack. Each actuator may have a single EAP layer, but each may also comprise their own laminate structure of multiple EAP layers.

The examples above make use of an electroactive polymer layer which is actuated to make it expand, and this is then translated into a bending movement.

The electrode arrangement may comprise electrodes on opposite faces of the electroactive polymer layer as shown above. These provide a transverse electric field for controlling the thickness of the EAP layer. This in turn causes expansion or contraction of the EAP layer in the plane of the layer.

The electrode arrangement may instead comprise a pair of comb electrodes on one face of the electroactive polymer layer. This provides in-plane electric field, for directly controlling the dimensions of the layer in-plane. This can again be used to induce bending. The stack structure described above may also be applied. FIG. 10 shows a pair of interleaved comb electrodes 100, 102 which may be applied to one side only of the EAP layer of each actuator.

As mentioned above the same structure may be used as a sensor. Externally induced bending generates a change in electric field which results in measurable signals on the electrodes.

The individual units in the stack may for example have dimensions of 10 mm×10 mm×0.5 mm. A typical and non-limiting size range may be from 50 mm×50 mm×2 mm to 2 mm×2 mm×0.1 mm.

Materials suitable for the EAP layer are known. Electroactive polymers include, but are not limited to, the subclasses: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride tri-fluoroethylene-chlorofluoroethylene (PVDF-TrFE-CFE), Polyvinylidene fluoride trifluoroethylene-chlorotrifluoro-ethylene) (PVDF-TrFE-CTFE), Polyvinylidene fluoride-hexafluoropropylene (PVDF HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Additional passive layers may be provided for influencing the behavior of the EAP layer in response to an applied electric field.

The EAP layer may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The materials for the different layers will be selected for example taking account of the elastic moduli (Young's moduli) of the different layers.

Additional layers to those discussed above may be used to adapt the electrical or mechanical behavior of the device, such as additional polymer layers.

The EAP devices may be electric field driven devices or ionic devices. Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

The device may be used as a single actuator, or else there may be a line or array of the devices, for example to provide control of a 2D or 3D contour.

The invention can be applied in many EAP applications, including examples where a passive matrix array of actuators is of interest.

In many applications the main function of the product relies on the (local) manipulation of human tissue, or the actuation of tissue contacting interfaces. In such applications EAP actuators provide unique benefits mainly because of the small form factor, the flexibility and the high energy density. Hence EAP's can be easily integrated in soft, 3D-shaped and/or miniature products and interfaces. Examples of such applications are:

Skin cosmetic treatments such as skin actuation devices in the form of EAP-based skin patches which apply a constant or cyclic stretch to the skin in order to tension the skin or to reduce wrinkles;

Respiratory devices with a patient interface mask which has an EAP-based active cushion or seal, to provide an alternating normal pressure to the skin which reduces or prevents facial red marks;

Electric shavers with an adaptive shaving head. The height of the skin contacting surfaces can be adjusted using EAP actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of EAP transducers which is integrated in or near the user interface;

Catheters with a steerable tip to enable easy navigation in tortuous blood vessels.

Another category of relevant application which benefits from EAP actuators relates to the modification of light. Optical elements such as lenses, reflective surfaces, gratings etc. can be made adaptive by shape or position adaptation using EAP actuators. Here the benefits of EAPs are for example the lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A bending actuator device or sensor device for sensing bending, comprising:
a stack of units arranged in a stacking direction, each unit of the stack of units comprising at least one electroactive polymer and drive electrodes for driving the at least one electroactive polymer so that the at least one electroactive polymer deforms in the stacking direction in response to a drive signal applied to the drive electrodes; or for sensing a signal generated in response to deformation of the at least one electroactive polymer in the stacking direction,
wherein adjacent units in the stack of units are slidable relatively to each other.

2. The device as claimed in claim 1, wherein units of the stack of units are stacked with adjacent units of the stack of units in frictional contact with each other.

3. The device as claimed in claim 2, wherein the drive electrodes of each of the stack of units are placed on opposite sides of the at least one electroactive polymer, and wherein the drive electrodes are formed from a low friction, elastic, or viscous material layer.

4. The device as claimed in claim 1, further comprising a friction reducing layer between each adjacent pair of units of the stack of units.

5. The device as claimed in claim 4, wherein the friction reducing layer is freestanding, or is bonded to a unit of the stack of units on one side.

6. The device as claimed in claim 5, wherein the friction reducing layer comprises a solid material layer.

7. The device as claimed in claim 6, wherein the solid material layer comprises PTFE, a fluoropolymer, a textile, a fluid, a gel, a foam, or a foil.

8. The device as claimed in claim 4, wherein the friction reducing layer is bonded to units of the stack of units on each side, and wherein the friction reducing layer comprises an elastic layer or a viscous material layer.

9. The device as claimed in claim 4, wherein the friction reducing layer comprises a spacer arrangement.

10. The device as claimed in claim 1, further comprising a mechanical coupling between units of the stack of units which fixes relative positions in the stacking direction, but allows relative movement in an in-plane direction of the stack of units.

11. The device as claimed in claim 1, further comprising a holder for setting an in-plane location of the stack of units.

12. The device as claimed in claim 11, wherein the holder comprises a housing having a recess in which the stack of units is located.

13. The device as claimed in claim 12, further comprising a lid over the stack of units, which forms an input or output interface for the device.

14. The device as claimed in claim 13, wherein the stack of units is sandwiched between a base of the recess and the lid without physical connection between units of the stack of units.

15. The device as claimed in claim 1, comprising a bending actuator.

16. The device as claimed in claim 1, wherein a sliding direction of the at least one electroactive polymer is perpendicular to the stacking direction of the stack of units.

17. The device as claimed in claim 1, wherein a lower unit of the stack of units is always below, in a front view of the stack of units, with respect to each surface of a higher unit of the stack of units.

* * * * *